United States Patent
Nguyen et al.

(10) Patent No.: US 9,704,622 B2
(45) Date of Patent: Jul. 11, 2017

(54) LASER-CONTROLLED OPTICAL TRANSCONDUCTANCE VARISTOR SYSTEM

(71) Applicants: Hoang T. Nguyen, Livermore, CA (US); Brent C. Stuart, Livermore, CA (US)

(72) Inventors: Hoang T. Nguyen, Livermore, CA (US); Brent C. Stuart, Livermore, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 308 days.

(21) Appl. No.: 14/642,692

(22) Filed: Mar. 9, 2015

(65) Prior Publication Data
US 2017/0084365 A1      Mar. 23, 2017

Related U.S. Application Data

(60) Provisional application No. 61/949,897, filed on Mar. 7, 2014.

(51) Int. Cl.
| | |
|---|---|
| *H01L 31/08* | (2006.01) |
| *H01C 7/00* | (2006.01) |
| *H01S 5/42* | (2006.01) |
| *H01S 5/323* | (2006.01) |
| *H01S 5/00* | (2006.01) |
| *F21V 8/00* | (2006.01) |
| *H01S 5/06* | (2006.01) |
| *H01L 31/09* | (2006.01) |
| *H01L 31/16* | (2006.01) |

(52) U.S. Cl.
CPC .............. *H01C 7/00* (2013.01); *G02B 6/0005* (2013.01); *H01L 31/09* (2013.01); *H01L 31/162* (2013.01); *H01S 5/0085* (2013.01); *H01S 5/0615* (2013.01); *H01S 5/32316* (2013.01); *H01S 5/423* (2013.01)

(58) Field of Classification Search
CPC ......... H01C 7/00; H01L 31/09; H01L 31/162; H01S 5/0085; H01S 5/0615
USPC ..................................................... 338/15, 13
See application file for complete search history.

(56) References Cited

U.S. PATENT DOCUMENTS

| | | | | |
|---|---|---|---|---|
| 4,691,111 | A * | 9/1987 | Bovino | H03K 17/78 250/551 |
| 6,614,583 | B1 * | 9/2003 | Wachsman | H04B 10/503 359/326 |
| 6,759,668 | B2 * | 7/2004 | Matsuo | H01L 27/1443 250/214 SW |
| 8,258,632 | B1 * | 9/2012 | Sullivan | H01L 31/09 257/433 |

(Continued)

*Primary Examiner* — Kyung Lee
(74) *Attorney, Agent, or Firm* — James S. Tak (57) ABSTRACT

An optical transconductance varistor system having a modulated radiation source configured to provide modulated stimulus, a wavelength converter operably connected to the modulated radiation source to produce a modulated stimulus having a predetermined wavelength, and a wide bandgap semiconductor photoconductive material in contact between two electrodes. The photoconductive material is operably coupled, such as by a beam transport module, to receive the modulated stimulus having the predetermined wavelength to control a current flowing through the photoconductive material when a voltage potential is present across the electrodes.

10 Claims, 7 Drawing Sheets

(56) References Cited

U.S. PATENT DOCUMENTS

| | | | | |
|---|---|---|---|---|
| 8,455,328 B2* | 6/2013 | Mazzola | ............. | H01L 31/0312 |
| | | | | 257/103 |
| 8,563,930 B2* | 10/2013 | Harris | ...................... | H03C 1/34 |
| | | | | 250/200 |
| 2004/0081919 A1* | 4/2004 | Kishima | ................ | G11B 7/261 |
| | | | | 430/321 |
| 2010/0282949 A1* | 11/2010 | Caporaso | ................ | H01L 31/09 |
| | | | | 250/214 SW |
| 2012/0002263 A1* | 1/2012 | Furuya | ................... | G03B 21/28 |
| | | | | 359/238 |
| 2015/0187470 A1* | 7/2015 | Sampayan | .......... | H01L 31/0224 |
| | | | | 257/76 |

* cited by examiner

LASER-CONTROLLED OPTICAL TRANSCONDUCTANCE VARISTOR SYSTEM

CROSS-REFERENCE TO RELATED APPLICATIONS

This application claims the benefit of U.S. provisional application No. 61/949,897 filed Mar. 7, 2014, which is incorporated by reference herein.

FEDERALLY SPONSORED RESEARCH OR DEVELOPMENT

The United States Government has rights in this invention pursuant to Contract No. DE-AC52-07NA27344 between the United States Department of Energy and Lawrence Livermore National Security, LLC for the operation of Lawrence Livermore National Laboratory.

TECHNICAL FIELD

This patent document relates to high speed optical switching.

BACKGROUND

High speed switching components are useful in implementation of various commercially valuable products, including wireless systems and mobile devices such as smartphones.

Photoconductive switches and switch packages typically consist of a wide bandgap photoconductive material (such as GaN, ZnO, diamond, AlN, SiC, BN, etc.), a source for energetic photons (e.g. a laser), a method to couple the laser into the switch, and electrodes in contact with the photoconductive material across which a voltage may be applied. Arranged as such, the photoconductive switch package may be characterized as a three terminal device similar to transistors; with one of the terminals being a laser input or the voltage input to the laser system. When the photoconductive switch material is illuminated such as by a laser, the laser photons change the conductivity of the photoconductive material and make it viable as an optically controlled switch.

SUMMARY

One aspect of the present invention includes an optical transconductance varistor system comprising: a modulated radiation source configured to provide modulated stimulus; a wavelength converter operably connected to the modulated radiation source to produce a modulated stimulus having a predetermined wavelength; and a wide bandgap semiconductor photoconductive material in contact between two electrodes and operably coupled to receive the modulated stimulus having the predetermined wavelength to control a current flowing through the photoconductive material when a voltage potential is present across the electrodes.

The present invention is generally directed to a laser-controlled and operated optical transconductance varistor system in which a source of high energy radiation and signal modulation generates modulated radiation, which is then converted to a different wavelength more suitable for the photoconductive material type, before being optically transported to a photoconductive material (e.g. a wide bandgap semiconductor material such as for example GaN, SiC, etc.) arranged between two electrodes as a photoconductive switch (hereinafter "PCS"). With this arrangement, modulating the laser output serves to control the flow of current across the photoconductive material and across the electrodes in the presence of a voltage potential between the electrodes. The present document provides techniques in which a modulation radiation source that generates the minimum needed energy required for a single switch and techniques to generate high energy modulated radiation.

In the various embodiments of the present invention, the radiation source could be a suitable laser source, such as pulsed laser sources, including 1) a pulsed semiconductor based device such as a vertical cavity surface emitting laser (VCSEL) or distributed feedback (DFB) and 2) the Q-switch configuration could be seeded with a modulator semiconductor device. It is also appreciated that the radiation source may be a laser, such as solid-state, fiber, semiconductor, liquid, and gas, and including laser utilizing harmonic generation; or x-ray source, or subatomic particle sources. Additionally, the modulation of the radiation source may be provided either electronically or optically using, such as for example, an arbitrary waveform generator (AWG), programmable pulsed power supply, a pulse generator, laser Q-switcher, laser mode locker, electro-optical modulator, acoustic-optical modulator, semiconductor saturable absorbers, single or two frequency modulated injection seeding, mode-locked laser injection seed source, or pulsed laser pumping.

In some example embodiments, the radiation source may be a semiconductor (diode) laser, which is electrically a P-i-n diode. The active region of the laser diode is in the intrinsic (I) region, and the carriers, electrons and holes, are pumped into it from the N and P regions respectively. While initial laser research was conducted on simple P-N diodes, all modern lasers use the double-heterostructure implementation, where the carriers and the photons are confined in order to maximize their chances for recombination and light generation. Unlike a regular diode used in electronics, the goal for a laser diode is that all carriers recombine in the I region, and produce light. Thus, laser diodes are fabricated using direct bandgap semiconductors. The laser diode epitaxial structure is grown using one of the crystal growth techniques, usually starting from an N doped substrate, and growing the I doped active layer, followed by the P doped cladding, and a contact layer. The active layer most often consists of quantum wells, which provide lower threshold current and higher efficiency.

One type of semiconductor (diode) lasers used in the present invention is a double heterostructure lasers—In these devices, a layer of low bandgap material is sandwiched between two high bandgap layers. One commonly-used pair of materials is gallium arsenide (GaAs) with aluminium gallium arsenide (AlxGa(1-x)As). Each of the junctions between different bandgap materials is called a heterostructure, hence the name "double heterostructure laser" or DH laser. Another type of semiconductor (diode) laser used in the present invention is a vertical-cavity surface-emitting lasers (VCSELs) have the optical cavity axis along the direction of current flow rather than perpendicular to the current flow as in conventional laser diodes. The active region length is very short compared with the lateral dimensions so that the radiation emerges from the surface of the cavity rather than from its edge as shown in the figure. The reflectors at the ends of the cavity are dielectric mirrors made from alternating high and low refractive index quarter-wave thick multilayer.

The wavelength converter used in the present system preferably operates to convert the length of the beam from the radiation source into a wavelength tuned to the bandgap energy of the PCS. For example, For SiC 6H which has a bandgap of 3.00 eV and associated wavelength of 413 nm, the wavelength converter would convert the wavelength to 413 nm. Similarly, for SiC 4H, GaN 2H, and GaAs having respective bandgap energies and wavelengths of 3.20 eV and 387 nm; 3.40 eV and 365 nm; and 1.43 eV and 867 nm, the wavelength converter would convert the beam wavelength to 387 nm, 365 nm, and 867 nm, respectively.

In some embodiments, the various components for the modulated radiation source, wavelength converter, beam transport, and PCS may be integrated within a same package, such as by fabricating on a common substrate, so that modulation, higher energy generation, and current control may be achieved in an integrated packaged for compact and easy fabrication, and to provide compact laser-based photoconductive switches for various high voltage and high speed switching operations. The various embodiments of the present invention for integrated laser-switch designs can be implemented in an alignment-free, monolithic assembly, where all of the optical components are directed in contact with each other.

DETAILED DESCRIPTION

Figure 1:
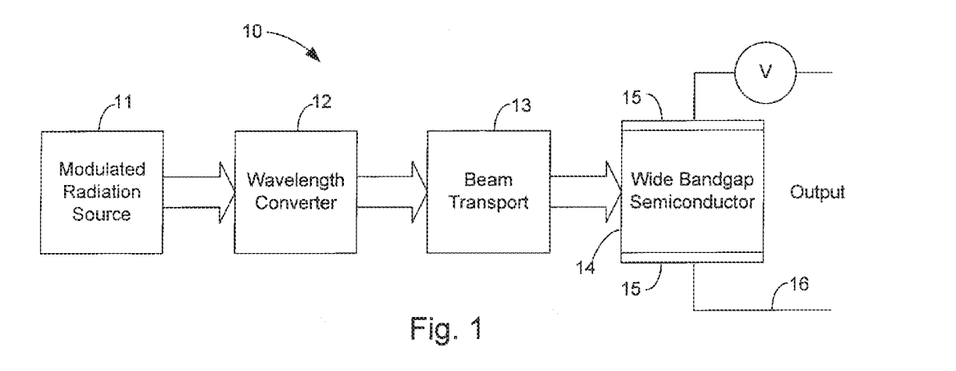
FIG. 1 shows a schematic view of a first example embodiment of the laser-operated optical transconductance varistor system present of the present invention.

Turning now to the drawings, FIG. 1 shows a schematic view of a first example embodiment of the laser-operated optical transconductance varistor system present of the present invention, generally indicated at 10, and including a modulated radiation source 11, a wavelength converter 12, beam transport 13, and a wide bandgap semiconductor photoconductive material 14 that is arranged between electrodes 15 so that by producing a modulated stimulus with a predetermined wavelength and directing it to the photoconductive immaterial 14, the material then operates to control current across the electrodes when a voltage potential is present thereacross. As shown in FIG. 1, the voltage potential may be provided by a voltage source of a circuit 16.

Figure 2:
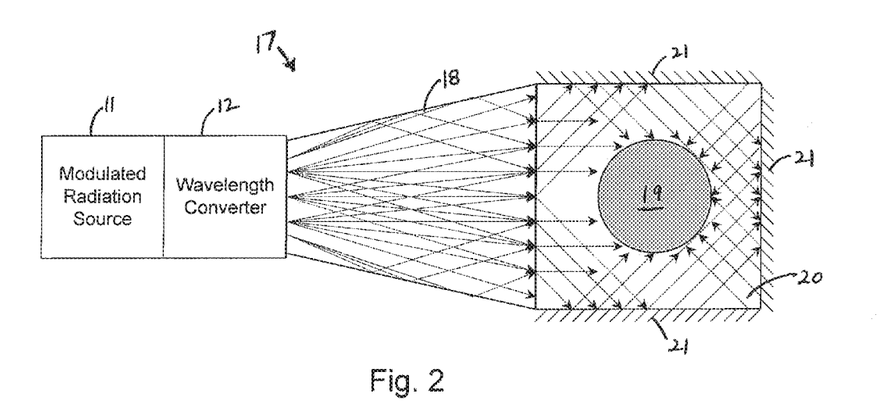
FIG. 2 shows a schematic view of a second example embodiment of the laser-operated optical transconductance varistor system present of the present invention, with the beam transport particularly shown configured as a beam pump surrounding a photoconductive material and an optical dispersion element particularly shown as a tapered beam pipe.
Figure 3:
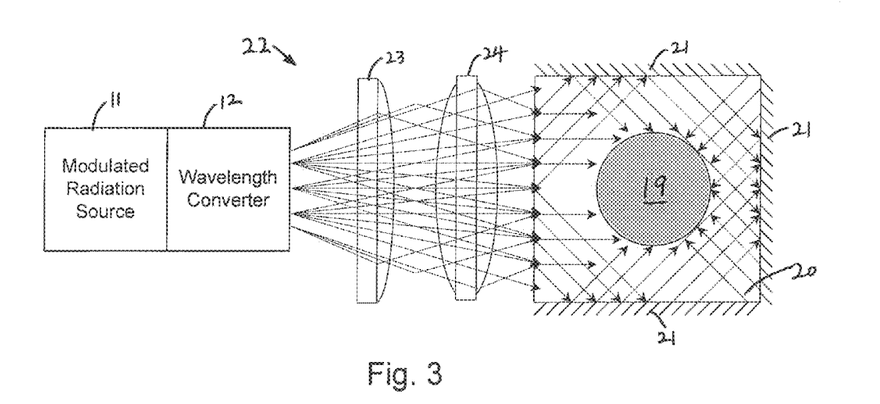
FIG. 3 shows a schematic view of another embodiment also having the beam pump surrounding the photoconductive material as in FIG. 2, but using bulk free-space optics to transport the modulated radiation to the photoconductive material.

FIG. 2 shows a schematic view of a second example embodiment of the laser-operated optical transconductance varistor system present of the present invention, with the beam transport particularly shown configured as a beam pump 20 surrounding a photoconductive material 19 and an optical dispersion element particularly shown as a tapered beam pipe 18 which directs modulated radiation into the beam pump 20 also shown having reflective sides 21 for directing radiation inward toward the photoconductive material. The tapered beam pipe and the beam pump together operate to distribute radiation to all sides of the photoconductive material 19 to render it conductive. As such the induced conductivity of the photoconductive material may be uniformly produced in the substrate material. And FIG. 3 shows another schematic view of another embodiment also having the beam pump 20 surrounding the photoconductive material 19. However, in this case, free-standing optical elements, e.g. 23, 24, are used to transport the modulated radiation to the photoconductive material.

Figure 4:
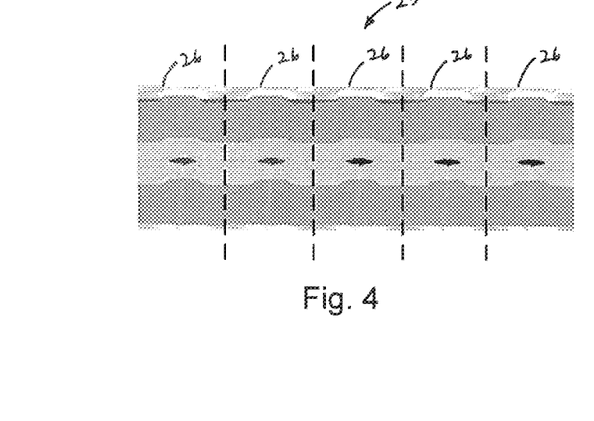
FIG. 4 shows a double heterostructure laser diode array used in the third and fourth example embodiments of the laser-operated optical transconductance varistor system present of the present invention.
Figure 5:
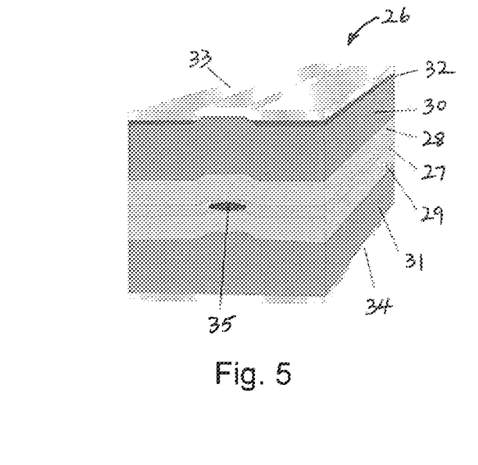
FIG. 5 shows an enlarged view of a representative single emitter of the double heterostructure laser diode array of FIG. 4.
Figure 6:
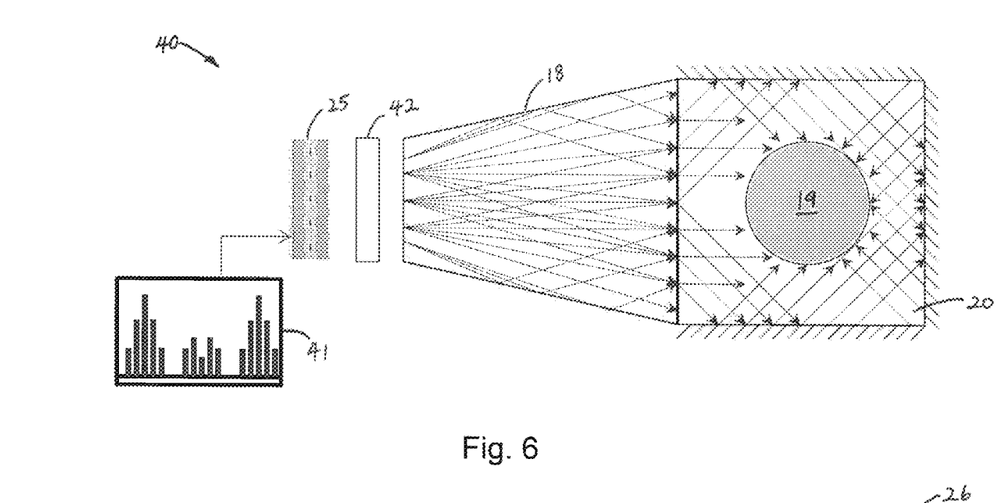
FIG. 6 shows a schematic view of another example embodiment of the laser-operated optical transconductance varistor system present of the present invention, utilizing the double heterostructure laser diode array of FIG. 4, and having a tapered light pipe optical transport interfacing a beam pump surrounding the photoconductive material.

FIG. 4 shows a double heterostructure laser diode array 25 used in another example embodiment 40 of the laser-operated optical transconductance varistor system present of the present invention, shown in FIG. 6. In particular, the array 25 is shown comprising multiple individual emitters 26. And FIG. 5 shows an enlarged view of a representative single emitter 26 of the double heterostructure laser diode array 25. In particular, the example individual emitter is shown having an active region 27 between for example p AlGaAs layer 28 and an n AlGaAs layer 29, with another p+ GaAs layer 30 over the p AlGaAs layer 28, and an n GaAs substrate 31 below the n AlGaAs layer 29. Metalllic contacts 33 and 34 provide the outer layers, with a proton bombarded semi-insulating barrier between the top metallic contact 33 and the p+ GaAs layer. An emitting region is shown at 35. FIG. 6 shows a schematic view of another example embodiment of the laser-operated optical transconductance varistor system present of the present invention, utilizing the double heterostructure laser diode array of FIG. 4, and having a tapered light pipe 18 optical transport interfacing a beam pump 20 surrounding the photoconductive material 19. A modulated signal is also shown provided by a modulation source 41. It is appreciated as discussed for FIG. 3 that other beam transports other than a tapered light pipe may be used.

Figure 7:
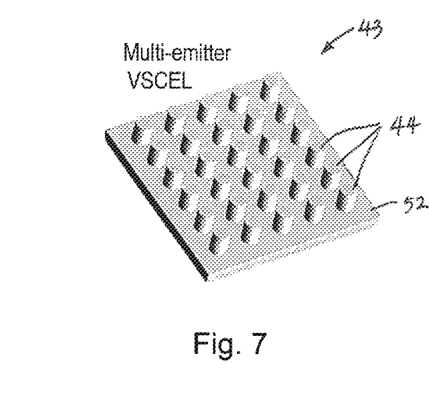
FIG. 7 shows a multi-emitter vertical-cavity surface-emitting laser (VCSEL) used in another example embodiments of the laser-operated optical transconductance varistor system present of the present invention.
Figure 8:
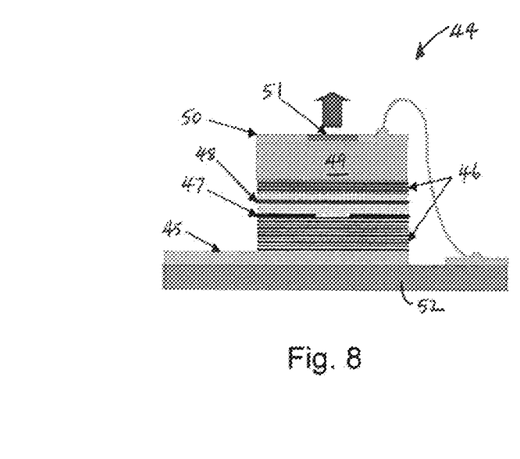
FIG. 8 shows an enlarged view of a representative single VCEL emitter of the multi-emitter shown in FIG. 7.
Figure 9:
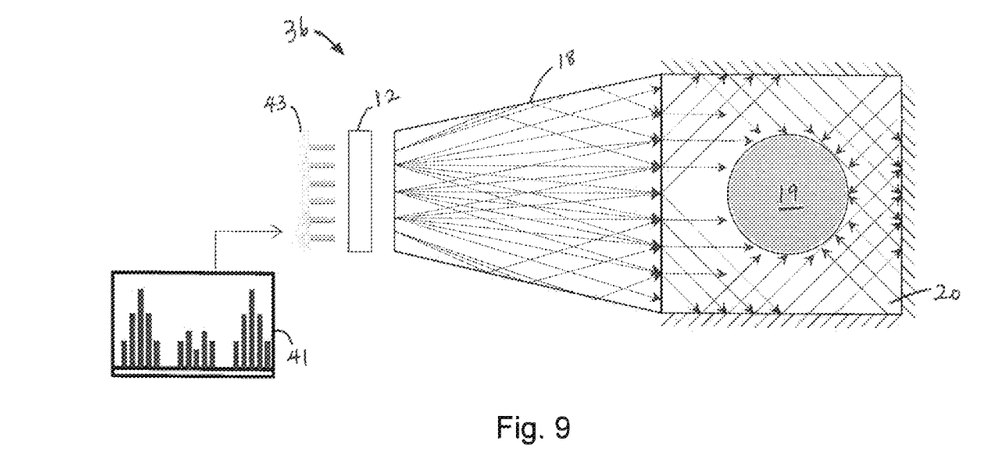
FIG. 9 shows a schematic view of another example embodiment of the laser-operated optical transconductance varistor system present of the present invention, utilizing the multi-emitter VCSEL of FIG. 7, and having a tapered light pipe optical transport interfacing a beam pump surrounding the photoconductive material.

FIG. 7 shows a multi-emitter vertical-cavity surface-emitting laser (VCSEL) structure 43 used in the example embodiment 36 of the laser-operated optical transconductance varistor system present of the present invention, shown in FIG. 9. In particular, the structure 43 is shown comprising a 2D array of individual VCSELs 44 formed on a substrate 52. And FIG. 8 shows an enlarged view of a representative single VCEL emitter 44 of the multi-emitter shown in FIG. 7. In particular, a p-contact layer 45 is shown formed on a head spreader 52, followed by a distributed Bragg Reflector (DBR) 46. An oxide aperture 47 is provided, followed by an active region 48, and another DBR layer 46. A GaAs substrate 49 follows next, followed by a N-contact layer 50. An AR-coating is also shown at 51, through which light is output from the device. FIG. 9 shows a schematic view of another example embodiment 36 of the laser-operated optical transconductance varistor system present of the present invention, utilizing the multi-emitter VSCEL structure of FIG. 7, and having a tapered beam pipe 18 providing optical transport to a beam pump 20 surrounding the photoconductive material 19. A modulated signal is also shown provided by a modulation source 41.

Figure 10:
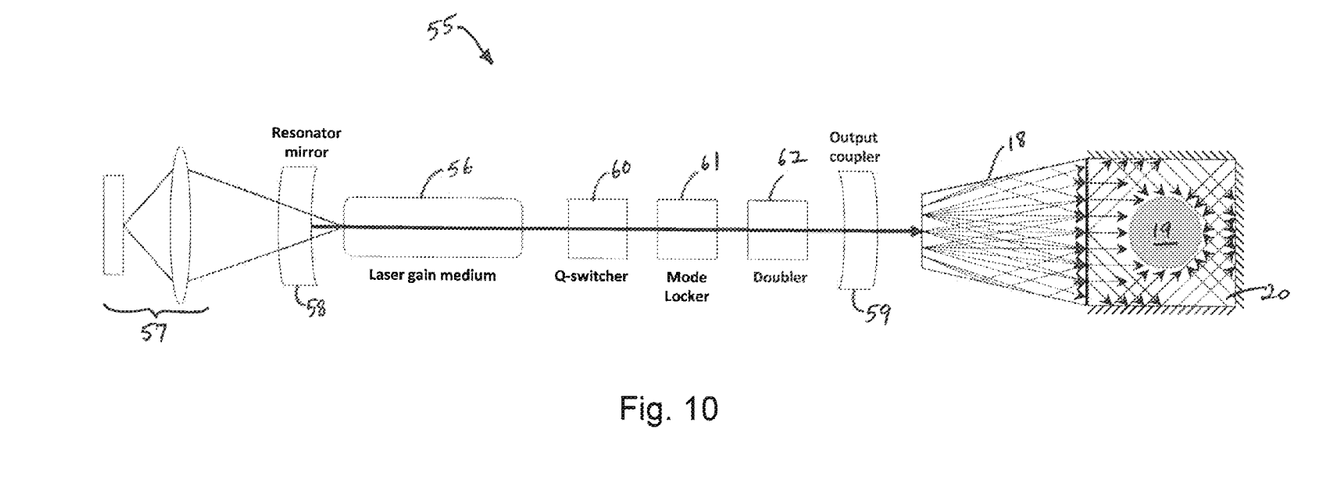
FIG. 10 shows another embodiment of the laser-operated optical transconductance varistor system present of the present invention, in which a solid state laser is utilized with the Q-switcher component producing a high energy radiation burst and the mode locker generating the desired modulation.
Figure 11:
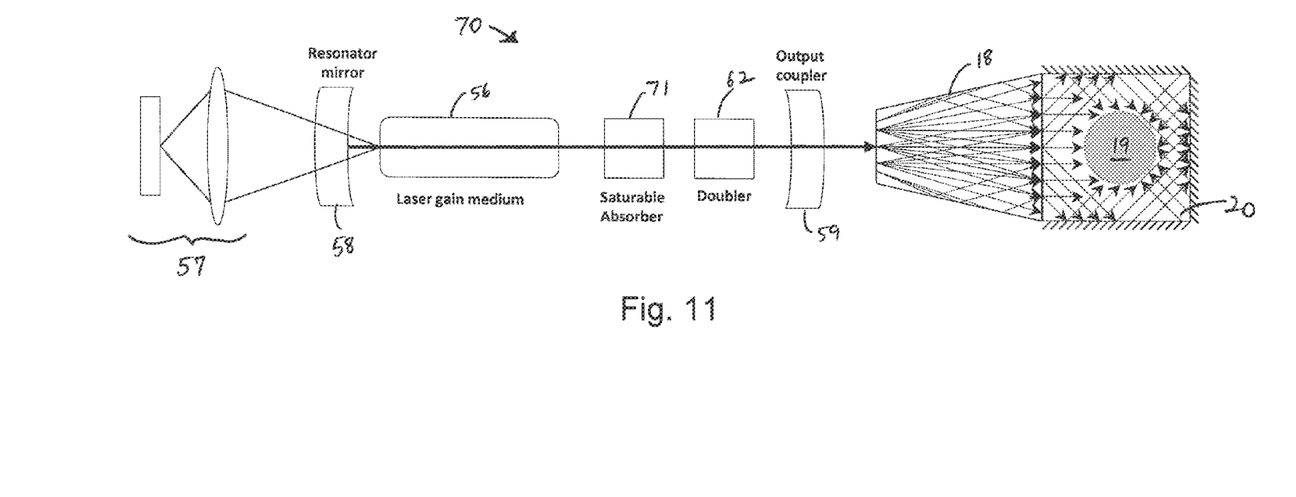
FIG. 11 shows another embodiment of the laser-operated optical transconductance varistor system present of the present invention, in which a solid state laser is utilized with a saturable absorber component producing a high energy radiation burst and the desired modulation.
Figure 12:
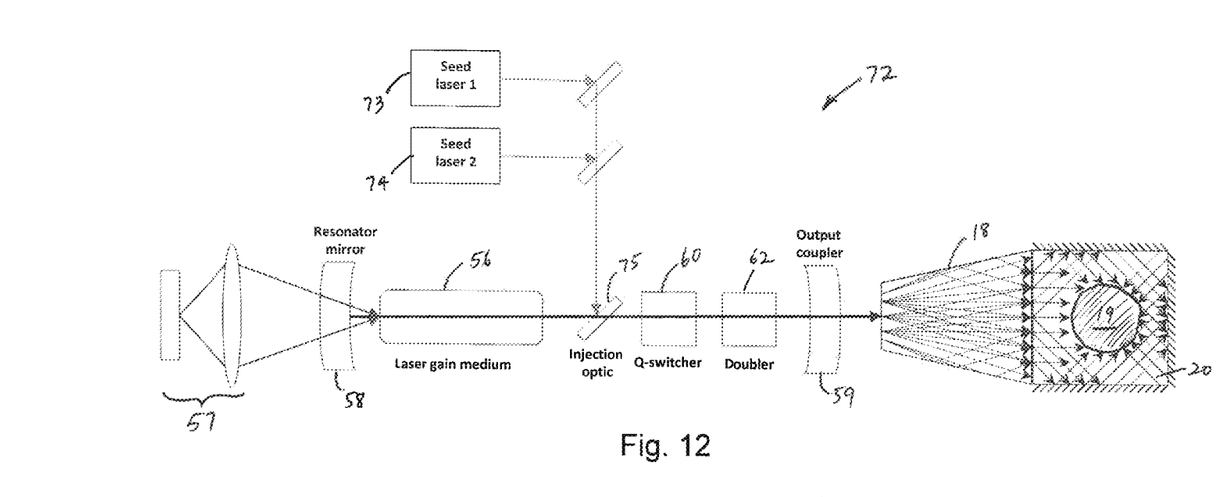
FIG. 12 shows another embodiment of the laser-operated optical transconductance varistor system present of the present invention, in which a solid state laser is utilized with the Q-switcher component produces high energy radiation burst and the desired modulation is generated by two frequency injection seed source
Figure 13:
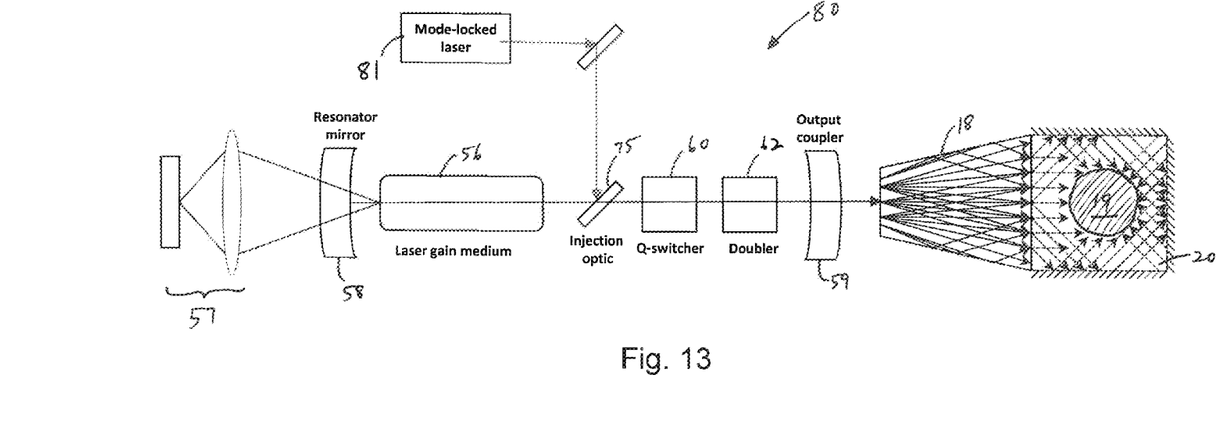
FIG. 13 shows another embodiment of the laser-operated optical transconductance varistor system present of the present invention, in which a solid state laser is utilized with the Q-switcher component producing a high energy burst and the desired modulation generated by a mode locked injection seed source of the desired modulation frequency.
Figure 14:
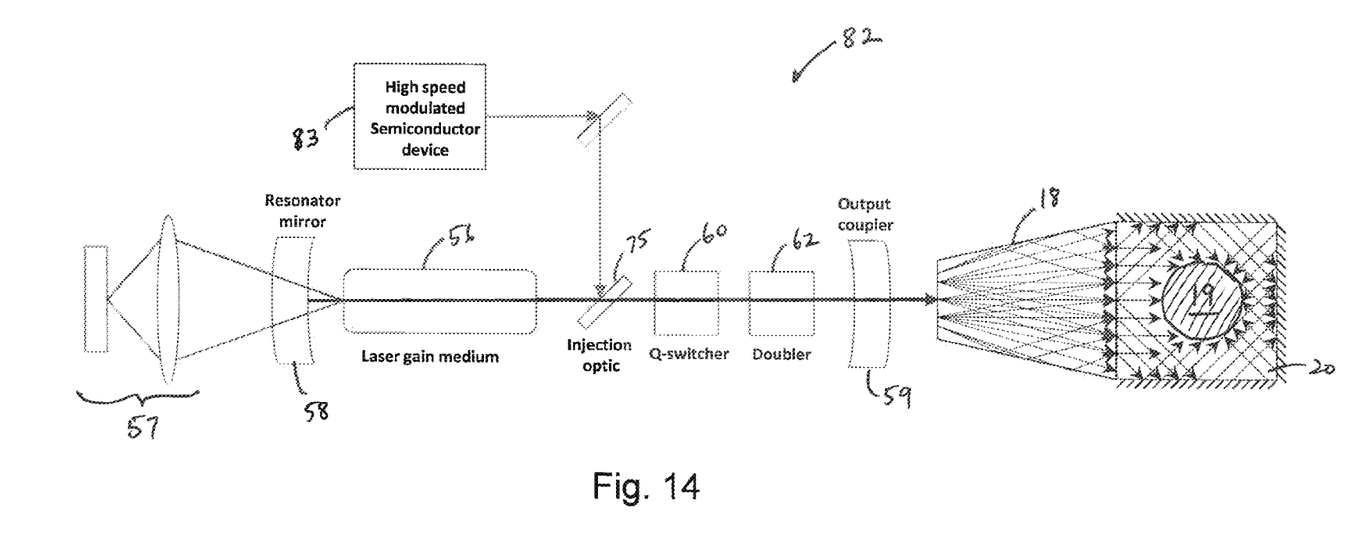
FIG. 14 shows another embodiment of the laser-operated optical transconductance varistor system present of the present invention, in which a solid state laser is utilized with the Q-switcher component producing the high-energy radiation burst and the desired modulation is generated by a modulated semiconductor laser injection seed source of the desired modulation frequency.

FIGS. 10-14 show various embodiments of a solid state laser-based system and various methods of providing modulated stimulus to the photoconductive material. In particular, FIG. 10 shows another embodiment 55 of the laser-operated optical transconductance varistor system present of the present invention, in which a solid state laser is utilized with a Q-switcher component 60 to produce a high energy radiation burst and a mode locker 61 for generating the desired modulation. Other components shown for the solid state laser include a laser gain medium 56 provided in an optical cavity between resonator mirror 58 and output coupler 59, and pumped by a pump module 57. A doubler 62 is also shown provided to perform the wavelength conversion. And FIG. 11 shows another embodiment 70 of the laser-operated optical transconductance varistor system present of the present invention, in which a solid state laser is utilized with a saturable absorber component 71 to produce a high energy radiation burst and the desired modulation. Other parts of the solid state laser are also shown similar to FIG. 10. And FIG. 12 shows another embodiment 72 of the laser-operated optical transconductance varistor system present of the present invention, in which the Q-switcher component 60 produces high energy radiation burst and the desired modulation is generated by two frequency injection seed sources 73 and 74 injected into the optical cavity by injection optic 75. And FIG. 13 shows another embodiment 80 of the laser-operated optical transconductance varistor system present of the present invention, in which the Q-switcher component 60 produces a high energy burst and the desired modulation is generated by a mode locked injection seed source 81 of the desired modulation frequency and injected into the optical cavity by injection optic 75. And finally FIG. 14 shows another embodiment 82 of the laser-operated optical transconductance varistor system present of the present invention, in which the Q-switcher component 60 produces the high-energy radiation burst and the desired modulation is generated by a modulated semiconductor laser injection seed source 83 of the desired modulation frequency which is injected in the optical cavity via injection optic 75. In all of FIGS. 10-14, a doubler 62 is shown utilized as the wavelength converter. While a tapered light pipe 18 is shown providing optical transport, it is appreciated that other means for beam transporat may be used, as previously described in FIG. 3.

Figure 15:
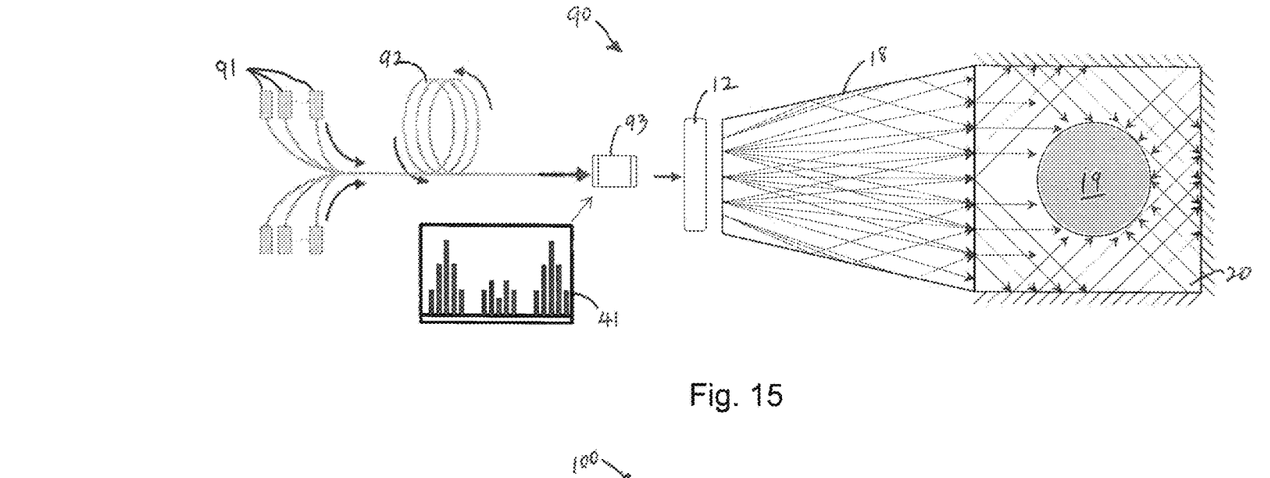
FIG. 15 shows another embodiment of the laser-operated optical transconductance varistor system present of the present invention, in which the photoconductive switch is being pumped by a high-power fiber-based laser pump modules, and modulated by an optic modulator, and having a tapered light pipe optical transport interfacing a beam pump surrounding the photoconductive material.
Figure 16:
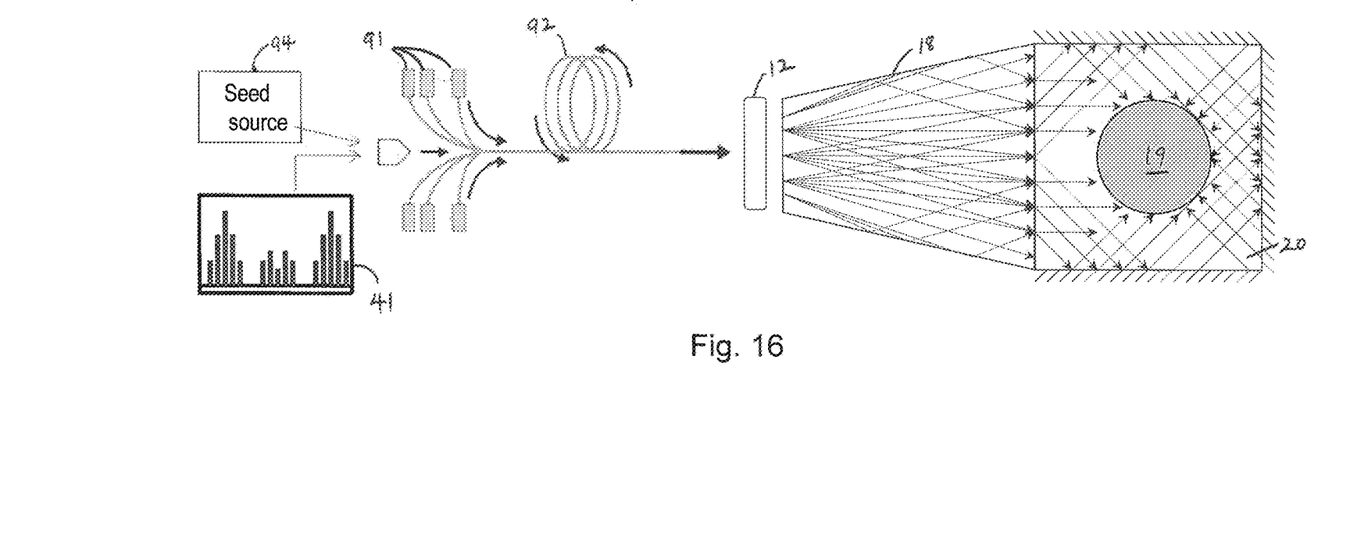
FIG. 16 shows another embodiment of the laser-operated optical transconductance varistor system present of the present invention, in which the photoconductive switch is being pumped by a high-power fiber-based laser pump modules, and modulated by a seed laser source, and having a tapered light pipe optical transport interfacing a beam pump surrounding the photoconductive material.

And FIGS. 15 and 16 show various embodiments of a fiber-based laser system and various method of providing modulated stimulus to the photoconductive material. In particular, FIG. 15 shows another embodiment 90 of the laser-operated optical transconductance varistor system present of the present invention, in which the photoconductive switch 19 is being pumped by a high-power fiber-based laser pump module having a pump diode for fiber 91, active fiber 92, and modulated by an optic modulator 93 receiving modulation input from a modulation source 41. And FIG. 16 shows another embodiment 100 of the laser-operated optical transconductance varistor system present of the present invention, in which the photoconductive switch 19 is being pumped by a high-power fiber-based laser pump module having a pump diode for fiber 91, active fiber 92, and modulated by a seed laser source 94. While a tapered light pipe 18 is shown providing optical transport, it is appreciated that other means for beam transporat may be used, as previously described in FIG. 3.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

We claim:

1. An optical transconductance varistor system comprising:
    a modulated radiation source configured to provide modulated stimulus;
    a wavelength converter operably connected to the modulated radiation source to produce a modulated stimulus having a predetermined wavelength; and
    a wide bandgap semiconductor photoconductive material in contact between two electrodes and operably coupled to receive the modulated stimulus having the predetermined wavelength to control a current flowing through the photoconductive material when a voltage potential is present across the electrodes.

2. The system of claim 1, wherein the predetermined wavelength produced by the wavelength converter corresponds to a bandgap energy of the wide bandgap semiconductor material.

3. The system of claim 1, further comprising:
    a beam pump surrounding the photoconductive material for directing the modulated stimulus into the photoconductive material; and
    an optical diffusion element arranged to diffuse/disperse the modulated stimulus prior to entering the beam pump and the photoconductive material.

4. The system of claim 3, wherein the optical diffusion element is a tapered light pipe.

5. The system of claim 1, wherein the modulated radiation source is a modulated laser.

6. The system of claim 5,
    wherein the modulated laser is a multi-emitter laser-diode array.

7. The system of claim 6,
    wherein the multi-emitter laser-diode array is an array of VCSELs.

8. The system of claim 6,
    wherein the multi-emitter laser-diode array is a double heterostructure laser diode array.

9. The system of claim 1,
    wherein the modulated radiation source is modulated by a modulation source selected from a group consisting of an arbitrary waveform generator and a pulse generator.

10. The system of claim 1,
    wherein the modulated radiation source, the wavelength converter, and the photoconductive material are integrated together on a substrate.

* * * * *